United States Patent
Han (10) Patent No.: US 10,161,030 B2
(45) Date of Patent: Dec. 25, 2018

(54) DEPOSITION MASK AND DEPOSITION APPARATUS HAVING THE SAME

(71) Applicant: Samsung Display Co., Ltd., Yongin, Gyeonggi-Do (KR)

(72) Inventor: Jeongwon Han, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1118 days.

(21) Appl. No.: 14/012,917

(22) Filed: Aug. 28, 2013

(65) Prior Publication Data

US 2014/0209025 A1 Jul. 31, 2014

(30) Foreign Application Priority Data

Jan. 29, 2013 (KR) .................. 10-2013-0010023

(51) Int. Cl.
| | | |
|---|---|---|
| C23C 14/04 | (2006.01) | |
| C23C 18/06 | (2006.01) | |
| C23C 16/04 | (2006.01) | |
| C23C 10/04 | (2006.01) | |
| C23C 8/04 | (2006.01) | |
| C30B 25/04 | (2006.01) | |
| H01L 51/00 | (2006.01) | |

(52) U.S. Cl.
CPC ............ *C23C 14/042* (2013.01); *C23C 14/04* (2013.01); *C23C 16/04* (2013.01); *C23C 16/042* (2013.01); *C23C 18/06* (2013.01); *C23C 8/04* (2013.01); *C23C 10/04* (2013.01); *C30B 25/04* (2013.01); *H01L 51/0011* (2013.01)

(58) Field of Classification Search
CPC ...... C23C 14/04; C23C 14/042; C23C 14/044; C23C 16/04; C23C 16/042; C23C 18/06; C23C 18/1603; C23C 18/1605; C23C 8/04; C23C 10/04; H01L 51/0011; C30B 25/04
See application file for complete search history.

(56) References Cited

U.S. PATENT DOCUMENTS

| | | | | |
|---|---|---|---|---|
| 5,268,068 A | * | 12/1993 | Cowell | ............ G03F 1/20 216/100 |
| 6,641,674 B2 | * | 11/2003 | Peng | .......... C23C 14/24 118/723 VE |
| 8,169,768 B1 | * | 5/2012 | Tahmassebpur | .... H01L 21/6833 118/728 |
| 8,169,769 B2 | | 5/2012 | Regan | |
| 2006/0157319 A1 | | 7/2006 | Sato | |

(Continued)

FOREIGN PATENT DOCUMENTS

| | | |
|---|---|---|
| CN | 102148234 A | 8/2011 |
| CN | 102795613 A | 11/2012 |

(Continued)

*Primary Examiner* — Aiden Lee
(74) *Attorney, Agent, or Firm* — Lewis Roca Rothgerber Christie LLP (57) ABSTRACT

A deposition apparatus includes a deposition chamber, a deposition source, and a deposition mask. The deposition source is disposed in the deposition chamber and provides a deposition material to a deposition substrate. The deposition mask includes a body portion and a carbon layer. The carbon layer is disposed on a first surface making contact with the deposition mask and includes at least one of carbon nanotube or graphene.

13 Claims, 10 Drawing Sheets

(56) References Cited

U.S. PATENT DOCUMENTS

| | | | | |
|---|---|---|---|---|
| 2007/0132921 A1* | 6/2007 | Yoon | ............... | B82Y 20/00 |
| | | | | 349/107 |
| 2009/0061329 A1 | 3/2009 | Hirota | | |
| 2011/0143473 A1* | 6/2011 | Ji | ............... | C23C 14/042 |
| | | | | 438/46 |
| 2012/0025110 A1* | 2/2012 | Davis | ............... | H01J 5/18 |
| | | | | 250/505.1 |
| 2012/0298289 A1* | 11/2012 | Jiang | ............... | C01B 31/0469 |
| | | | | 156/155 |

FOREIGN PATENT DOCUMENTS

| | | |
|---|---|---|
| JP | 2002067267 A | 3/2002 |
| JP | 2002305079 A | 10/2002 |
| JP | 2005093484 A | 4/2005 |
| JP | 2006-205716 A | 8/2006 |
| JP | 2008150660 A | 7/2008 |
| JP | 2009-059804 A | 3/2009 |
| JP | 2010159454 A | 7/2010 |
| JP | 2010180438 A | 8/2010 |
| JP | 2011127218 A | 6/2011 |
| JP | 2012153595 A | 8/2012 |
| JP | 2012246209 A | 12/2012 |
| KR | 10-0561705 B1 | 3/2006 |
| KR | 10-2008-0000432 A | 1/2008 |
| KR | 10-2008-0020897 A | 3/2008 |
| KR | 10-2012-0073819 A | 7/2012 |
| TW | 201250042 | 12/2012 |

\* cited by examiner

DEPOSITION MASK AND DEPOSITION APPARATUS HAVING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 C.F.R. § 1.57.

This U.S. non-provisional patent application claims priority under 35 U.S.C. § 119 of Korean Patent Application No. 10-2013-0010023, filed on Jan. 29, 2013, the contents of which are hereby incorporated by reference in its entirety.

BACKGROUND

Field

The present disclosure relates to a deposition mask and a deposition apparatus having the deposition mask.

Description of the Related Art

In general, a flat panel display and a semiconductor device include a deposition material disposed on a substrate. The deposition material forms a pattern. A deposition mask is used to form the patterned deposition material.

The deposition mask comprises a metal material. The metal mask damages the pattern when the metal mask makes contact with the deposition substrate. The metal mask causes an arcing phenomenon due to a static electricity.

SUMMARY

The present disclosure provides a deposition mask preventing a deposition substrate from being damaged and having improved durability.

The present disclosure provides a deposition apparatus having the deposition mask.

Embodiments provide a deposition apparatus including a deposition chamber, a deposition source, and a deposition mask. The deposition source is disposed in the deposition chamber and provides a deposition material to a deposition substrate. The deposition mask is disposed to overlap with the deposition substrate.

The deposition apparatus further includes a holder disposed in the deposition chamber to hold the deposition substrate. The holder is rotated.

The deposition mask includes a body portion and a carbon layer. The body portion includes a first surface making contact with a deposition substrate and a second surface facing the first surface and a plurality of openings formed penetrating through the first surface and the second surface. The carbon layer is disposed on at least the first surface and includes at least one of a carbon nanotube or a graphene.

The carbon layer includes a first layer including the carbon nanotube. The carbon layer further includes a second layer including the graphene and being overlapped with the first layer. The carbon layer includes a plurality of first layers including the carbon nanotube and a plurality of second layers including the graphene.

The carbon layer is further disposed on the second surface. Each of the opening portions includes a sidewall to connect the first surface and the second surface, and the carbon layer is further disposed on the sidewall.

The sidewall includes a first slanted surface, a second slanted surface that faces the first slanted surface, a third slanted surface that connects the first slat surface and the second slanted surface, and a fourth slanted surface that faces the third slanted surface and connects the first slanted surface and the second slanted surface.

The first, second, third, and fourth slanted surfaces form an acute angle with respect to the first surface and form an obtuse angle with respect to the second surface. The first slanted surface and the second slanted surface form the same angle with respect to the first surface. The carbon layer is further disposed on the first slanted surface, the second slanted surface, the third slanted surface, and the fourth slanted surface.

According to the above, the deposition mask includes the carbon layer as its outer layer. The carbon layer includes at least one of the carbon nanotube or the graphene. The carbon layer has low surface resistance and high electrical conductivity, and thus the carbon layer has high heat conductivity and high durability. Therefore, the strength of the deposition mask is enhanced and the arcing phenomenon is reduced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a," "an," and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present embodiments will be explained in detail with reference to the accompanying drawings.

Figure 1:
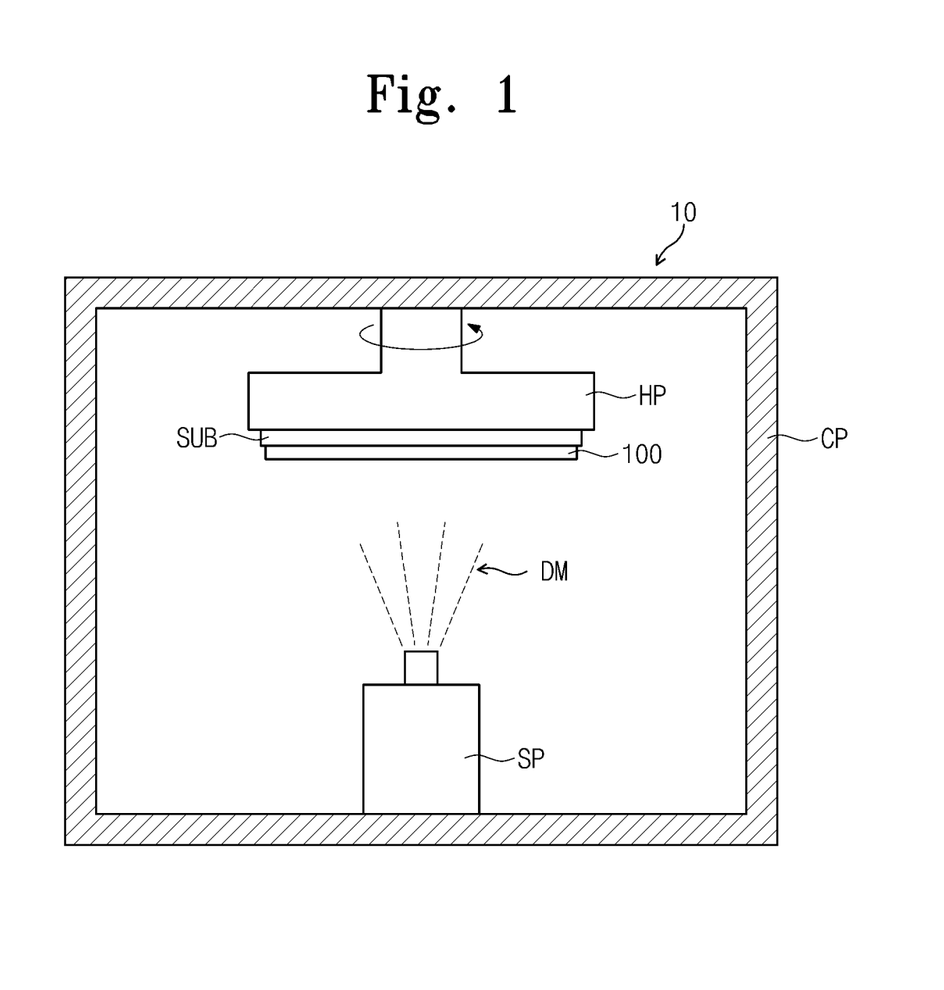
FIG. 1 is a cross-sectional view showing a deposition apparatus according to an example embodiment of the present disclosure.

FIG. 1 is a cross-sectional view showing a deposition apparatus according to an example embodiment of the present disclosure.

Referring to FIG. 1, a deposition apparatus 10 includes a deposition chamber CP, a deposition source SP, and a deposition mask 100.

The deposition chamber CP accommodates the deposition source SP, the deposition mask 100, and a deposition substrate SUB. The deposition chamber CP is maintained in a vacuum state during a deposition process. Although not shown in FIG. 1, a vacuum pump (not shown) may be connected to the deposition chamber CP to allow the inside of the deposition chamber CP to be maintained in the vacuum state.

A holder HP may be further disposed in the deposition chamber CP to hold the deposition substrate SUB. The holder HP holds the deposition substrate SUB and the deposition mask 100 using an electromagnetic force. To form a uniform deposition pattern, the holder HP may be rotated.

The deposition substrate SUB may be a flat member for a display or a semiconductor device. The deposition substrate SUB may comprise a glass, silicon, metal, or plastic material. Hereinafter, the deposition substrate SUB will be described as a display substrate for an organic light emitting display device.

The deposition substrate SUB includes a plurality of pixel areas (not shown) and a non-pixel area (not shown) disposed adjacent to the pixel areas. The pixel areas include an organic light emitting layer for organic light emitting devices.

The deposition source SP evaporates a deposition material DM and provides the evaporated deposition material DM to the deposition substrate SUB. The deposition source SP includes a container (not shown) to accommodate the deposition material DM and a heat source (not shown) to evaporate the deposition material DM.

The deposition material DM passes through a portion of the deposition mask 100, and then forms a deposition pattern. The deposition pattern formed by the deposition material DM may be the organic light emitting layer.

Figure 2:
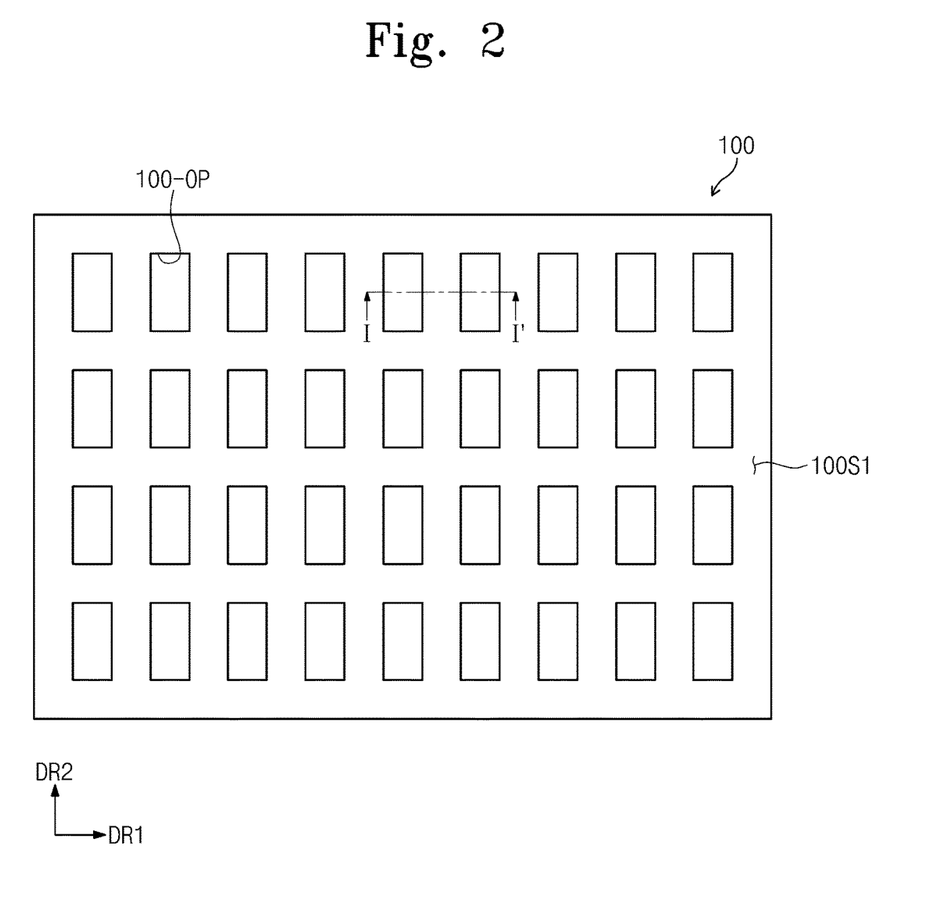
FIG. 2 is a front view showing a deposition mask shown in FIG. 1.
Figure 3:
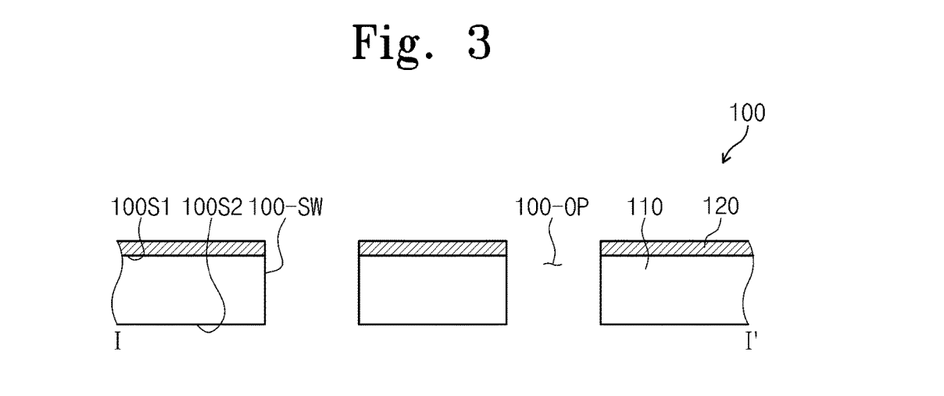
FIG. 3 is a cross-sectional view taken along a line I-I' of FIG. 2.

FIG. 2 is a front view showing a deposition mask shown in FIG. 1 and FIG. 3 is a cross-sectional view taken along a line I-I' of FIG. 2. Hereinafter, the deposition mask will be described in detail with reference to FIGS. 2 and 3.

The deposition mask 100 includes a body portion 110 and a carbon layer 120. The body portion 110 comprises a metal material and serves as a frame of the deposition mask 100. The body portion 110 includes a first surface 100S1 making contact with the deposition substrate SUB (refer to FIG. 1) and a second surface 100S2 into which the deposition material DM enters. The deposition mask 100 has a rectangular plate shape.

The body portion 110 includes a plurality of opening portions 100-OP formed penetrating through the first and second surfaces 100S1 and 100S2. Each of the opening portions 100-OP is defined by a sidewall 100-SW. The opening portions 100-OP are arranged in a matrix form. In FIG. 2, the opening portions 100-OP are arranged in four rows by nine columns.

The carbon layer 120 is disposed on at least the first surface 100S1. The carbon layer 120 includes at least one of carbon nanotube or graphene. The carbon nanotube includes hexagonal monomers, each having six carbon atoms, which are connected to each other to form the carbon nanotube. The carbon nanotube has a diameter in a range from a few nanometer to tens of nanometers. The graphene has a single-layered structure formed by hexagonal monomers, each having six carbon atoms. The graphene has a thickness of about 0.2 nanometers.

The graphene or the carbon nanotube has a low surface resistance and a high electrical conductivity, and thus the graphene or the carbon nanotube has a high heat conductivity and a high durability. Accordingly, the static electricity generated when the deposition mask 100 makes contact with the deposition substrate SUB is discharged through the carbon layer 120, so that the arcing phenomenon is reduced. The carbon layer 120 may be formed by various methods, e.g., a deposition method, a sputtering method, a spraying method, a dipping method, etc.

FIGS. 4A to 4D are cross-sectional views showing deposition masks according to another example embodiment of the present disclosure. Hereinafter, various deposition masks will be described with reference to FIGS. 4A to 4D, but detailed descriptions of the same deposition mask as the deposition mask described with reference to FIG. 3 will be omitted.

Figure 4A:
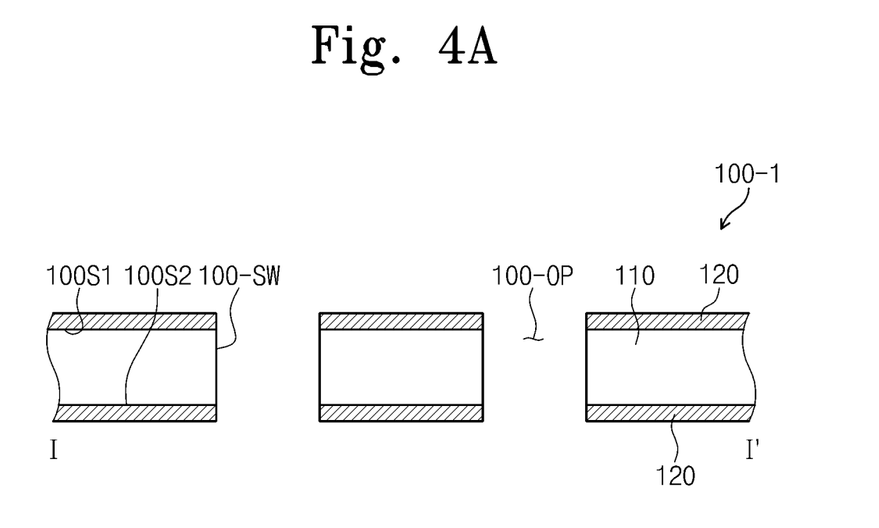
FIGS. 4A to 4D are cross-sectional views showing deposition masks according to another example embodiment of the present disclosure.
Figure 4B:
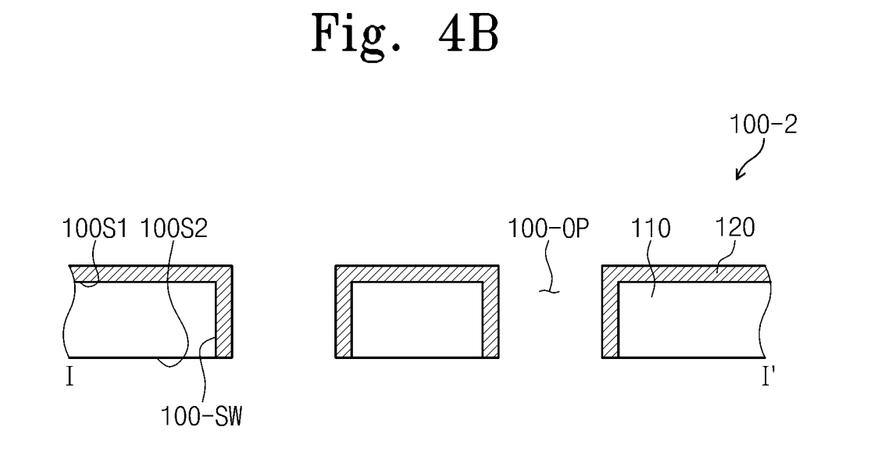
Figure 4C:
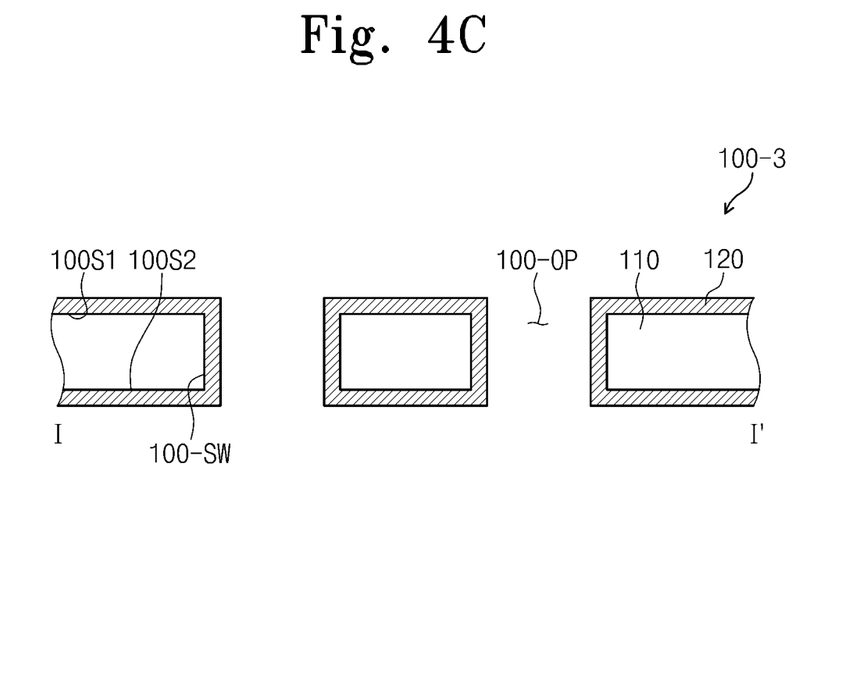

Referring to FIG. 4A, the carbon layer 120 is disposed on the first surface 100S1 and the second surface 100S2. In addition, referring to FIG. 4B, the carbon layer 120 is disposed on the first surface 100S1 and the sidewall 100-SW. Further, referring to in FIG. 4C, the carbon layer 120 is disposed on the first surface 100S1, the second surface 100S2, and the sidewall 100-SW. As an area in which the carbon layer 120 is disposed increases, a strength of the deposition masks 100-1 to 100-3 is enhanced, and the rate of discharge of the static electricity is improved.

Figure 4D:
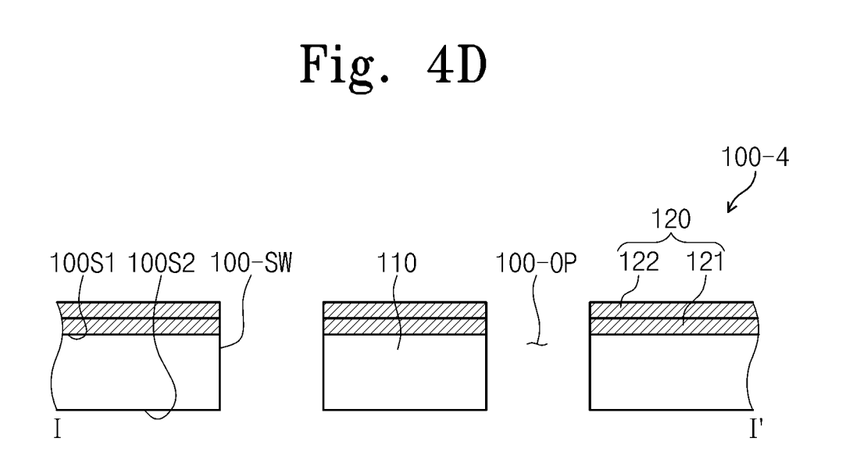

Referring to FIG. 4D, the carbon layer 120 may have a multi-layer structure of a first layer 121 and a second layer 122. The first layer 121 includes one of the carbon nanotube and the graphene or the second layer 122 includes the other one of the carbon nanotube and the graphene. Each of the first and second layers 121 and 122 may be provided in a plural number on the body portion 110. The first layers 121 and the second layers 122 are alternately and regularly stacked with each other, or irregularly stacked. In addition, different from that shown in FIG. 4D, the first layer 121 and the second layer 122 may be disposed not only on the first surface 100S1 but also on the second surface 100S2 and the sidewall 100-SW.

Figure 5A:
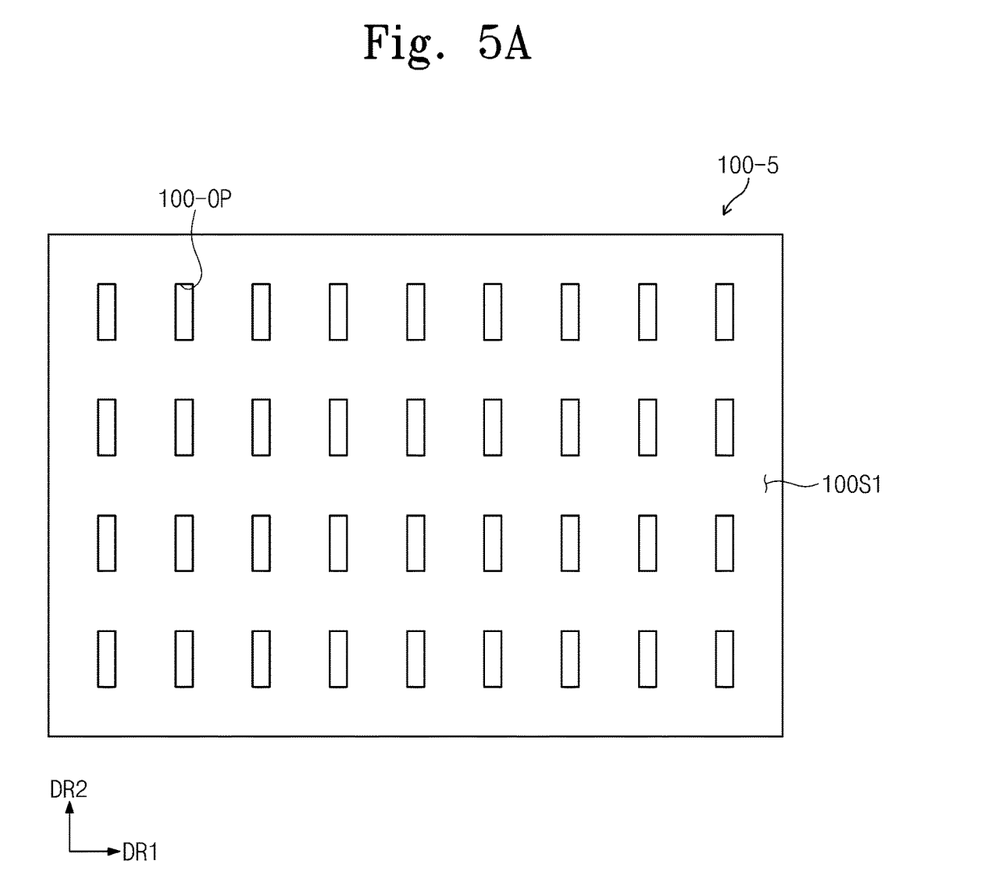
FIGS. 5A and 5B are front and rear views showing a deposition mask according to another example embodiment of the present disclosure.
Figure 5B:
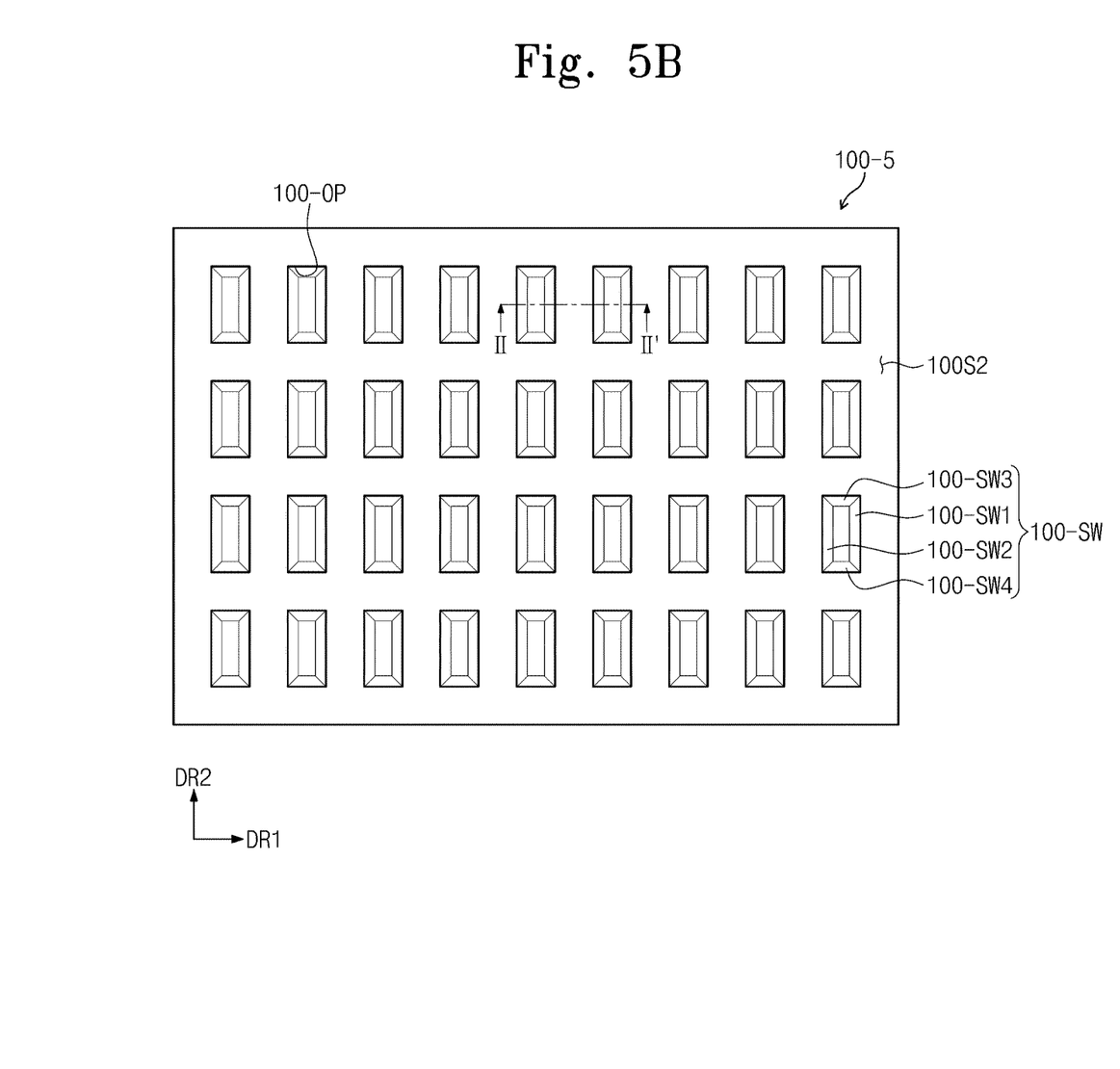
Figure 6:
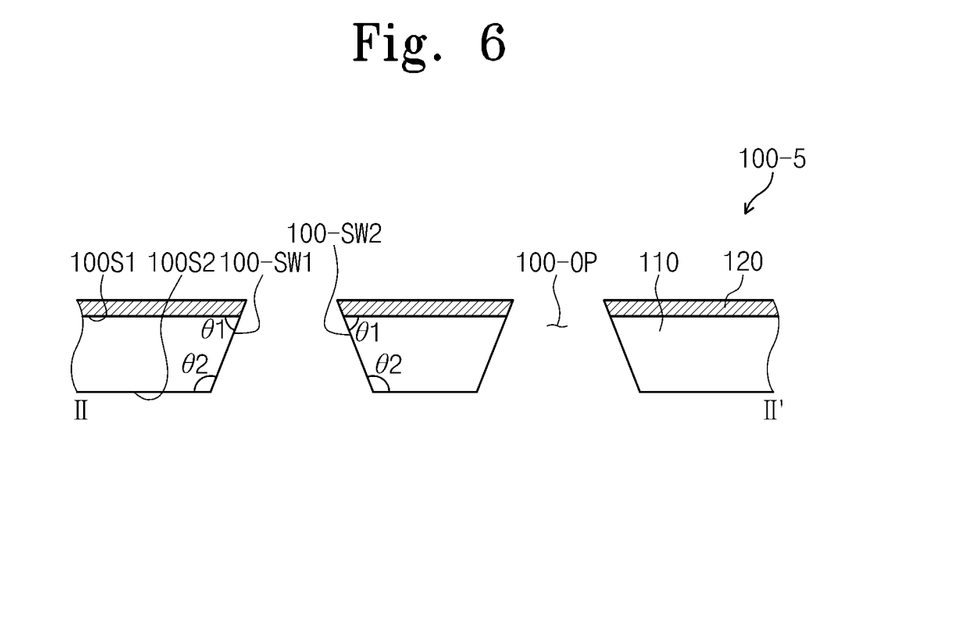
FIG. 6 is a cross-sectional view taken along a line II-II' of FIG. 5A.

FIGS. 5A and 5B are front and rear views showing a deposition mask according to another example embodiment of the present disclosure and FIG. 6 is a cross-sectional view taken along a line II-II' of FIG. 5A. Hereinafter, a deposition mask will be described in detail with reference to FIGS. 5A, 5B, and 6, however detailed descriptions of the same deposition mask as the deposition mask described with reference to FIGS. 1 to 4D.

The deposition mask 100-5 includes a body portion 110 and a carbon layer 120. The body portion 110 includes a plurality of opening portions 100-OP formed penetrating through the first surface 100S1 and the second surface 100S2. The carbon layer 120 is disposed on the first surface 100S1.

Each of the opening portions 100-OP is defined by a sidewall 100-SW. The sidewall 100-SW includes a first slanted surface 100-SW1, a second slanted surface 100-SW2, a third slanted surface 100-SW3, and a fourth slanted surface 100-SW4. The first slanted surface 100-SW1 and the second slanted surface 100-SW2 face each other in a first direction DR1, and the third slanted surface 100-SW3 and the fourth slanted surface 100-SW4 face each other in a second direction DR2 crossing the first direction DR1. The third slanted surface 100-SW3 and the fourth slanted surface 100-SW4 connect the first slanted surface 100-SW1 and the second slanted surface 100-SW2 to each other.

The first slanted surface 100-SW1, the second slanted surface 100-SW2, the third slanted surface 100-SW3, and the fourth slanted surface 100-SW4 increase an angle at which the deposition material DM enters into the opening portions 100-OP, e.g., an entering angle with respect to the opening portions. Thus, the deposition pattern corresponding to the opening portions 100-OP has a uniform thickness.

The first slanted surface 100-SW1 and the second slanted surface 100-SW2 form an obtuse angle with respect to the first surface 100S1 and form an acute angle with respect to the second surface 100S2. Although not shown in figures, the third slanted surface 100-SW3 and the fourth slanted surface 100-SW4 form the obtuse angle with respect to the first surface 100S1 and form the acute angle with respect to the second surface 100S2.

As shown in FIG. 6, the first slat surface 100-SW1 forms a first included angle θ1 with the first surface 100S1 and forms a second included angle θ2 with the second surface 100S2. The second slat surface 100-SW2 forms the first included angle θ1 with the first surface 100S1 and forms the second included angle θ2 with the second surface 100S2.

Although not shown in figures, the third slanted surface 100-SW3 and the fourth slanted surface 100-SW4 may have the same included angle with respect to the first surface 100S1 and with respect to the second surface 100S2.

Figure 7A:
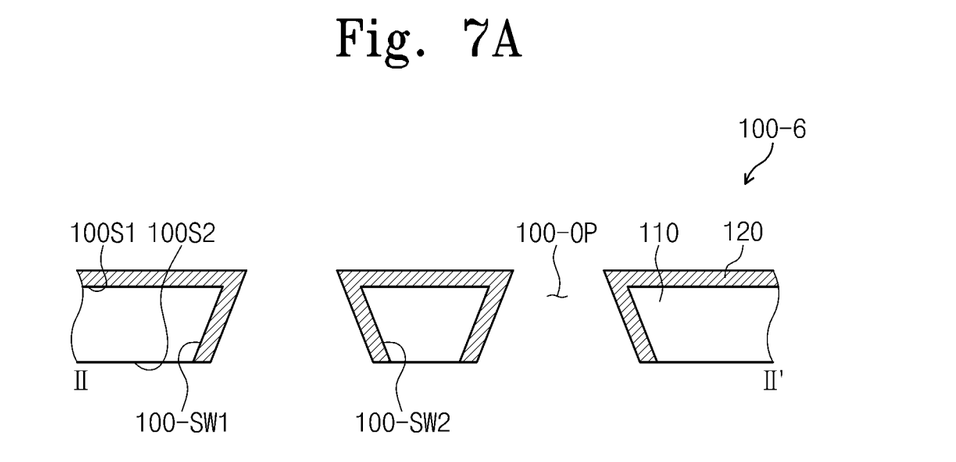
FIGS. 7A to 7C are cross-sectional views showing deposition masks according to another example embodiment of the present disclosure.
Figure 7B:
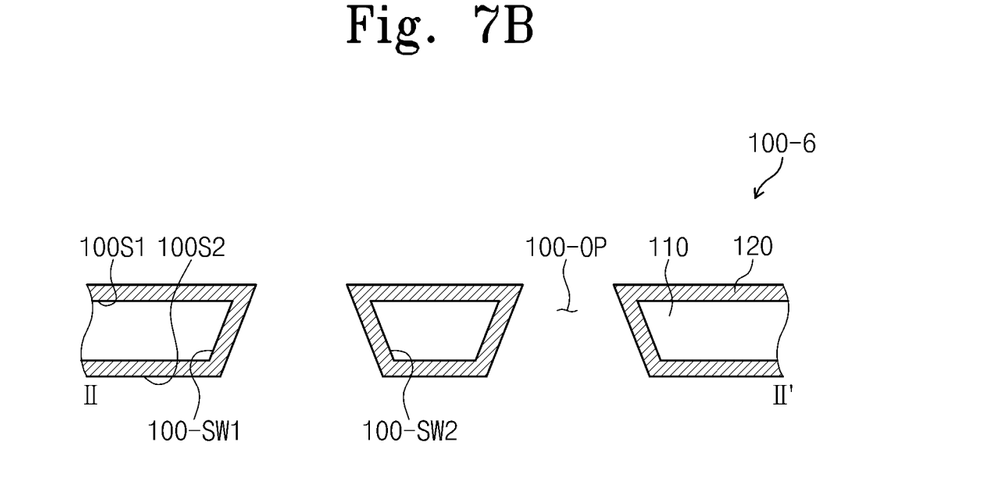
Figure 7C:
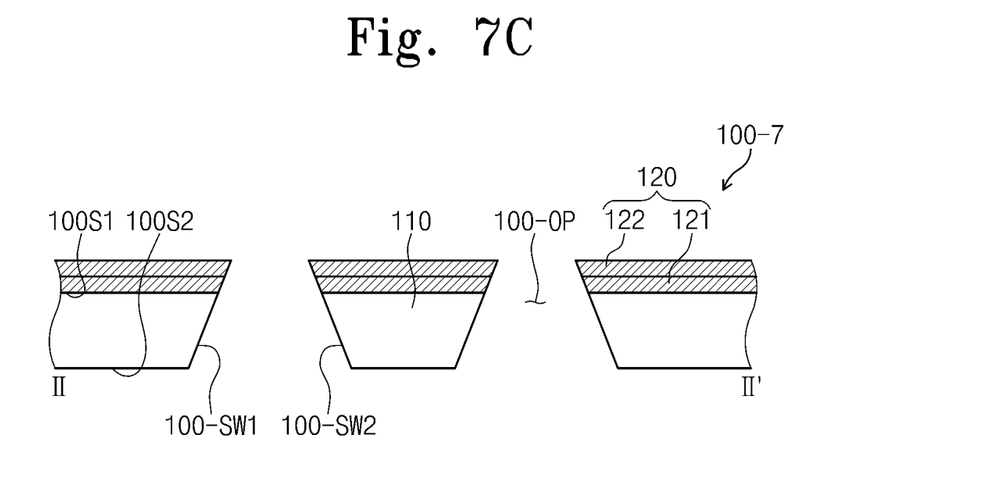

FIGS. 7A to 7C are cross-sectional views showing deposition masks according to another example embodiment of the present disclosure. Hereinafter, a deposition mask will be described in detail with reference to FIGS. 7A to 7C, however detailed descriptions of the same deposition mask as the deposition mask described with reference to FIGS. 5A to 6.

Referring to FIG. 7A, the carbon layer 120 may be disposed on the first surface 100S1 and the sidewall 100-SW. Referring to FIG. 7B, the carbon layer 120 may be disposed on the first surface 100S1, the second surface 100S2, and the sidewall 100-SW. As an area in which the carbon layer 120 is disposed increases, the strength of the deposition masks 100-6 and 100-7 is enhanced, and the rate of discharge of the static electricity is improved.

As shown in FIG. 7C, the carbon layer 120 may have a multi-layer structure of a first layer 121 and a second layer 122. The first layer 121 includes one of the carbon nanotube and the graphene or the second layer 122 includes the other one of the carbon nanotube and the graphene. Each of the first and second layers 121 and 122 may be provided in a plural number on the body portion 110.

Figure 8:
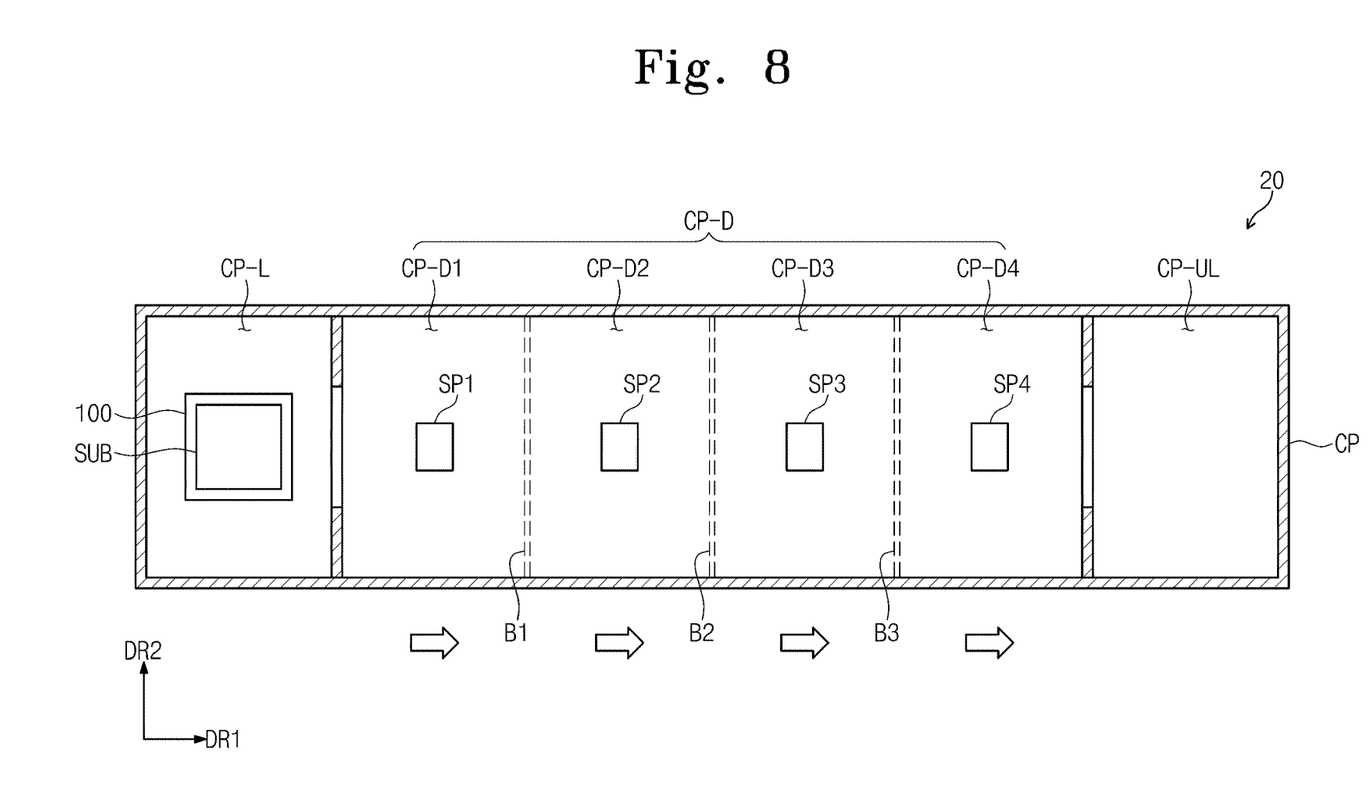
FIG. 8 is a plan view showing a deposition apparatus according to an example embodiment of the present disclosure.
Figure 9:
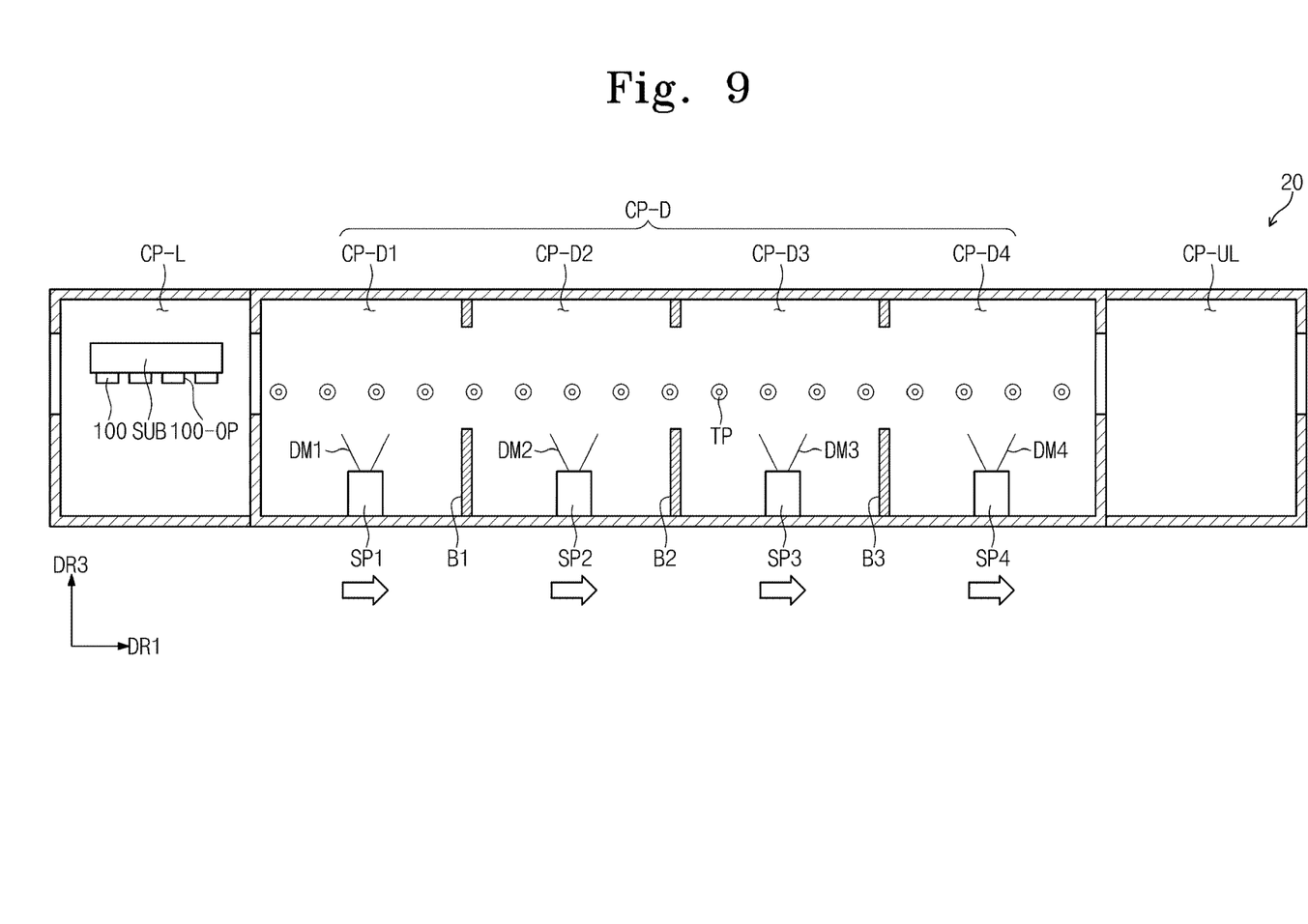
FIG. 9 is a cross-sectional view showing the deposition apparatus shown in FIG. 8.

FIG. 8 is a plan view showing a deposition apparatus according to an example embodiment of the present disclosure and FIG. 9 is a cross-sectional view showing the deposition apparatus shown in FIG. 8. Hereinafter, a deposition apparatus will be described in detail with reference to FIGS. 8 and 9, however detailed descriptions of the same deposition apparatus as the deposition apparatus described with reference to FIGS. 1 to 7C.

Referring to FIGS. 8 and 9, a deposition apparatus 20 includes a deposition chamber CP, a plurality of deposition sources SP1 to SP4, a deposition mask 100, and a transfer part TP.

The deposition chamber CP is divided into plural areas according to its function. The deposition chamber CP includes a loading area CP-L, a deposition area CP-D, and an unloading area CP-UL.

The deposition substrate SUB and the deposition mask 100 are coupled to each other in the loading area CP-L. The deposition substrate SUB and the deposition mask 100 are separated from each other in the unloading area CP-UL. The loading area CP-L, the deposition area CP-D, and the unloading area CP-UL may have different atmospheric pressures. To maintain the vacuum of the deposition area CP-D, a door may be disposed between the loading area CP-L and the deposition area CP-D and between the deposition area CP-D and the unloading area CP-UL.

The deposition area CP-D includes a plurality of deposition sources SP1 to SP4 disposed therein. FIGS. 8 and 9 show four deposition sources SP1 to SP4. The four deposition sources SP1 to SP4 are arranged in the first direction DR1 to be spaced apart from each other. The deposition areas CP-D are partitioned by a plurality of partition walls B1 to B3.

The deposition substrate SUB and the deposition mask 100, which are coupled to each other, are transferred by the transfer part TP. The transfer part TP may be a roller or a robot arm.

The deposition substrate SUB and the deposition mask 100, which are coupled to each other, receive different deposition materials DM1 to DM4 from the deposition sources SP1 to SP4. The deposition pattern disposed on the deposition substrate SUB has a multi-layer structure.

Although the example embodiments have been described, it is understood that the present embodiments should not be limited to these example embodiments but various changes and modifications can be made by one ordinary skilled in the art within the spirit and scope of the present embodiments as hereinafter claimed.

What is claimed is:

1. A deposition apparatus comprising:
    a deposition chamber;
    a deposition source disposed in the deposition chamber to provide a deposition material to a deposition substrate; and
    a deposition mask disposed to overlap with the deposition substrate, the deposition mask comprising:
    a body portion that includes a first surface configured to be facing the deposition substrate and a second surface opposite the first surface and a plurality of openings penetrating through the first surface and the second surface; and
    a carbon layer disposed between the deposition substrate and the deposition mask and in direct contact with the first surface and is configured to discharge static electricity from the substrate;
    wherein the carbon layer comprises a first layer including a carbon nanotube and a second layer including a graphene, and
    wherein the deposition material is provided to a portion of the deposition substrate exposed by the carbon layer and the openings.

2. The deposition apparatus of claim 1, further comprising a holder disposed in the deposition chamber to hold the deposition substrate.

3. The deposition apparatus of claim 2, wherein the holder is configured to be rotated.

4. The deposition apparatus of claim 1, wherein the deposition substrate corresponds to a portion of an organic light emitting display panel.

5. The deposition apparatus of claim 1, wherein the carbon layer is further disposed on the second surface.

6. The deposition apparatus of claim 1, wherein each of the opening portions comprises a sidewall connecting the first surface and the second surface, and the carbon layer is further disposed on the sidewall.

7. The deposition apparatus of claim 6, wherein the carbon layer is further disposed on the second surface.

8. The deposition mask of claim 1, wherein the first layer and the second layer are provided in a plurality, and each of the first layers and the second layers overlaps the first surface and the side walls.

9. The deposition apparatus of claim 1, wherein a portion of the carbon layer which contacts the first surface is one of the first layer and the second layer.

10. The deposition mask of claim 1, wherein the sidewall comprises: a first slanted surface; a second slanted surface that faces the first slanted surface; a third slanted surface that connects the first slat surface and the second slanted surface; and a fourth slanted surface that faces the third slanted surface and connects the first slanted surface and the second slanted surface.

11. The deposition mask of claim 10, wherein the first slanted surface, the second slanted surface, the third slanted surface, and the fourth slanted surface form an acute angle with respect to the first surface and form an obtuse angle with respect to the second surface.

12. The deposition mask of claim 11, wherein the first slanted surface and the second slanted surface form a same angle with respect to the first surface.

13. The deposition mask of claim 10, wherein the carbon layer is further disposed on the first slanted surface, the second slanted surface, the third slanted surface, and the fourth slanted surface.

* * * * *